Figure 1:
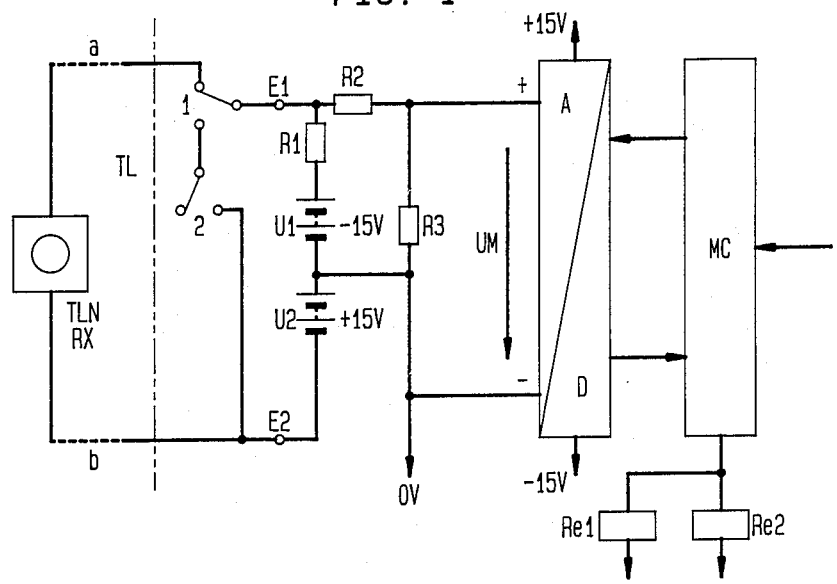

United States Patent [19]
Kaiser et al.

[11] Patent Number: 4,882,742
[45] Date of Patent: Nov. 21, 1989

[54] METHOD FOR MEASURING RESISTANCES, IN PARTICULAR RESISTANCES OF SUBSCRIBER'S LINES OF DIGITAL TIME DIVISION MULTIPLEX TELECOMMUNICATION NETWORKS

[75] Inventors: Wolfgang Kaiser, Munich; Werner Schmutzler, Fuerstenfeldbruck, both of Fed. Rep. of Germany

[73] Assignee: Siemens Aktiengesellschaft, Berlin and Munich, Fed. Rep. of Germany

[21] Appl. No.: 229,575

[22] Filed: Aug. 8, 1988

[30] Foreign Application Priority Data

Aug. 12, 1987 [DE] Fed. Rep. of Germany ....... 3726882

[51] Int. Cl.⁴ .......................... H04B 3/46; H04M 1/24
[52] U.S. Cl. ......................................... 379/30; 370/14; 324/64
[58] Field of Search ...................... 379/24, 30; 370/14; 324/62, 64

[56] References Cited
U.S. PATENT DOCUMENTS 4,691,337  9/1987  Held-Elbert et al. ................. 379/24

Primary Examiner—Stafford D. Schreyer
Attorney, Agent, or Firm—David N. Caracappa

[57] ABSTRACT

Before each actual resistance measurement, a first preliminary measurement with short-circuited measuring circuit and a second preliminary measurement with the measuring circuit operating at no-load are carried out. From the measured values of the preliminary measurement steps, a weighting factor is calculated, by which, subsequently, the difference between the actual measured value and the short-circuit value is multiplied to form the actual measurement results.

2 Claims, 1 Drawing Sheet

METHOD FOR MEASURING RESISTANCES, IN PARTICULAR RESISTANCES OF SUBSCRIBER'S LINES OF DIGITAL TIME DIVISION MULTIPLEX TELECOMMUNICATION NETWORKS

The invention relates to a method for measuring resistances, in particular resistances of subscriber's lines of digital time division multiplex telecommunication networks by using a measuring circuit and a signal processor. The signal processor controls the measuring circuit and determines the corresponding resistances in response to the measured values of voltages received from the measuring circuit.

In the course of such method it is necessary to align the measuring circuit at least at the time of its installation. The alignment is, specifically, for a zero value and for an upper limit value. Such alignment must also be repeated each time a testing unit, of which the measuring circuit is a component, is subjected to maintenance procedures. Until now, such alignments were carried out manually by setting potentiometers. In order to compensate for variations due to temperature and the aging of the components of the measuring circuit, high-quality components were used, and additional components were required for performing the compensation.

The task of the invention consists in developing a method for measuring resistances of the above mentioned kind in such a manner that the previously mentioned problems of alignment and the influence of temperature response and aging of the measuring circuit parts can be dealt with in a more favorable manner than up to now.

In accordance with principles of the present invention, a method for measuring resistances, in particular the resistance of a subscriber's line in a digital time division multiplex telecommunication network, may be implemented using a measuring circuit and a signal processor, which drives the measuring circuit and determines the corresponding resistance values from the values of the voltages supplied as measuring results by the measuring circuit. The method comprises the following steps. First, carrying out a first and a second preliminary measurement before each actual resistance measurement with the measuring circuit input terminals operating at no-load and short-circuit, respectively. Then, forming a weighting factor as the quotient of the difference between the first and second preliminary measurements and the difference between the corresponding calculated voltage values. Then, carrying out an actual resistance measurement with the measuring circuit input terminals coupled to the subscriber's line. Finally, weighting the difference between the value of the voltage supplied by the measuring circuit in the actual resistance measurement and the second preliminary measurement with the weighting factor and converting the weighted value into the resistance value of the measured resistance.

Due to the measures according to the invention, manual alignments become superfluous. Instead, at the beginning of each actual resistance measurement two additional preliminary measurements are carried out, the results of which are drawn on to form a weighting factor. The weighting of the voltage supplied by the actual resistance measurement by the measuring circuit with this weighting factor replaces alignment of the measuring circuit, and allows the measured value to be independent of temperature response and aging of the structural parts of the measuring circuit.

Figure 2:
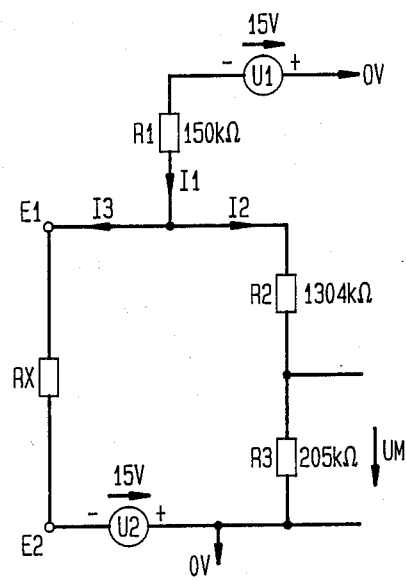

Below, the invention is explained in greater detail in conjunction with an embodiment with reference to a drawing, in which:

FIG. 1 is a diagram, partially in block form and partially in schematic form of a circuit for carrying out the method according to the invention; and FIG. 2 is a diagram illustrating an equivalent circuit of the measuring circuit of the arrangement according to FIG. 1.

The circuit shown in FIG. 1 for carrying out the method according to the invention, relates to the measurement of the resistance of a subscriber's line. In FIG. 1, a subscriber's line TL, including connected subscriber end unit TLN having a resistance RX, is connected to a resistance measuring circuit through wires a and b, and is illustrated on the left-hand side of FIG. 1.

The actual measuring circuit of FIG. 1 consists of the series connection of a resistor R1 and two voltage sources U1 and U2, which, for example, may each supply a voltage of 15 volts. The wires a and b of the subscriber's line are connected to input terminals E1 and E2 of this measuring circuit.

The voltage drop across resistor R3 represents the output voltage of the measuring circuit, while the connecting point of the voltage sources U1 and U2 serves as the reference voltage point. The voltage drop across resistor R1 is reduced by a voltage divider consisting of resistors R2 and R3, having one terminal connected to the input terminal E1 of the measuring circuit and another terminal connected to the reference point. The value of the voltage drop across resistor R1 is reduced to correspond to the operating range of a series-connected analog-to-digital converter A/D. A first input terminal (+) of the analog-to-digital converter A/D is connected to the divider point of the voltage divider, and a second input terminal (−) is connected to the reference point. By selecting the connecting point of the voltage sources U1 and U2 as reference point, entire operating range of the analog to digital converter A/D may be utilized.

An output terminal of the analog-to-digital converter A/D is connected to a digital signal processor in the form of a microprocessor MC, which processes the measured values from the measuring circuit. A first output terminal of the microprocessor MC is coupled to a control input terminal of the analog-to-digital converter A/D, and a second output terminal controls the measuring circuit through relays Re1 and Re2. The microprocessor is also coupled to utilization circuitry (not shown) to which the measured resistance value is supplied. This circuitry may, for example, include a display for displaying the value of the measured resistance.

The measuring circuit input terminal E1 is connected to a pole of a double throw contact 1 associated with relay Re1. A first terminal of contact 1 is connected to wire a of the subscriber's line TL. A second terminal of contact 1 is coupled to a pole of a single throw contact 2 associated with relay Re2. A terminal of contact 2 is coupled to input terminal E2 of the measuring circuit.

In operation, input terminal E1 of the measuring circuit is connectible through switching contact 1 of relay Re1 to wire a of the subscriber's line TL. In its other switched position contact 1 serves the function—together with the closed contact 2 of relay Re- 2—of short-circuiting the measuring circuit at its input end across connections E1 and E2.

FIG. 2 shows an equivalent circuit diagram of the described measuring circuit, and illustrates the voltage divider R2/R3 and the resistance RX of the connected subscriber end unit TLN in the subscriber's line TL. In conjunction with this circuit diagram the relationship between the measuring voltage UM across resistor R3, supplied to the analog-to-digital converter A/D, and the unknown resistance RX may become apparent. The following equations may be derived from FIG. 2:

$$-U1+U2+I1 \times R1+I3 \times RX=0 \quad (1)$$

$$-U1+I1 \times R1+I2 \times (R2+R3)=0 \quad (2)$$

$$I2=I1-I3 \quad (3)$$

$$UM=I2 \times R3 \quad (4)$$

Solving equations (1) through (4):

$$UM = R3 \times \frac{U1 \cdot RX + U2 \cdot R1}{RX \times (R1 + R2 + R3) + R1 \times (R2 + R3)} \quad (5)$$

In a preferred embodiment R1=150 kilohms, R2=1304 kilohms, R3=205 kilohms, U1 and U2=15 V. Substituting these values into equation (5), the following transfer function obtains:

$$UM = 205 \times 15 \frac{150 - RX}{RX \times 1,659 + 226,350} \quad (6)$$

Below, the manner of carrying out the method according to the invention using the circuit shown in FIG. 1 is described in greater detail.

According to the invention, before each actual resistance measurement, a first preliminary measurement with the measuring circuit having its input terminals operating at no-load (open circuit) is carried out. Referring to FIG. 1, the signal processor MC sends a first control command to relay Re1 which conditions its associated contact 1, to separate wire a of the subscriber's loop TL from the measuring circuit input terminal E1, and simultaneously sends a second control command to relay Re2 which conditions its associated contact 2 to assume its non-conducting position. The first preliminary measurement is then taken.

Then, a second preliminary measurement with the measuring circuit having its input terminals short-circuited is carried out. The signal processor MC sends a first control command to relay Re1 which conditions its associated contact 1 to connect input terminal E1 to the pole of contact 2; and simultaneously sends a second control command to relay Re2, which conditions its associated contact 2 to the assume its conducting position. These switching positions are—in each instance—is the one difference from the one illustrated in FIG. 1. The second preliminary measurement is then taken.

Two measured voltages, UMF and UM0, are developed as a result of the no-load (open circuit) and short-circuit preliminary measurements, respectively. These two voltages are converted to digital values by the analog-to-digital converter A/D and supplied to the digital signal processor MC. The digital signal processor forms a difference UMF−UM0, where UMF is the digitized value corresponding to the no-load (open circuit) measured voltage, and UM0 is the digitized value corresponding to the short-circuit measured voltage.

This difference is the zero-point corrected value of the no-load (open circuit) measured voltage.

Using equation (5), the value of the zero-point corrected value of the no-load (open circuit) measured voltage, based purely on calculation is:

$$UMC = \frac{U1 \cdot R3}{R1 + R2 + R3} - \frac{U2 \cdot R3}{R2 + R3} \quad (7)$$

where UMC is the calculated zero-point corrected value of the no-load (open circuit) voltage.

The digital signal processor forms a weighting factor, which is the quotient of the calculated zero-point corrected no-load (open circuit) voltage value UMC and the measured zero-point corrected no-load (open circuit) voltage UMF−UM0.

At this point begins the actual measurement of the resistance of the subscriber's line TL with switched on subscriber end unit TLN. For this purpose, the digital signal processor MC supplies appropriate control commands to relays Re1 and Re2, which conditions contacts 1 and 2, respectively, to connect the line a of the subscriber's line TL to input terminal E1 of the measuring circuit. The contacts, thus, are brought into the position illustrated in FIG. 1. The value of the voltage UM present at the output of the measuring circuit is stored in the digital signal processor MC after analog-to-digital conversion. Then, the difference between this measured voltage and the previously measured digitized short-circuit voltage is calculated in signal processor MC. This difference value is then multiplied by the weighting factor.

Lastly, the voltage value weighted in this manner is converted according to the equation (5) into a resistance value. This resistance value is output and displayed, which concludes the measuring procedure.

We claim:

1. A method for measuring resistances, in particular the resistance of a subscriber's line in a digital time division multiplex telecommunication network, using a measuring circuit and a signal processor, which drives the measuring circuit and determines the corresponding resistance values from the values of the voltages supplied as measuring results by the measuring circuit, said method comprising the steps of:

carrying out a first and a second preliminary measurement before each actual resistance measurement with the measuring circuit input terminals operating at no-load and short-circuit respectively;

forming a weighting factor as the quotient of the difference between calculated voltage values corresponding to the first and second preliminary measurements, respectively, and the difference between the first and second preliminary measurements;

carrying out an actual resistance measurement with the measuring circuit input terminals coupled to said subscriber's line; and weighting the difference between the value of the voltage supplied by the measuring circuit in said actual resistance measurement and said second preliminary measurement with said weighting factor and converting the weighted value into the resistance value of the measured resistance.

2. The method of claim 1, wherein:

said signal processor is a digital signal processor and further includes an analog-to-digital converter; and each of said carrying out measurements steps comprises a further step of converting said voltage values obtained from the measuring circuit by said analog to digital converter to digitized values.

* * * * *